(12) United States Patent
Yamamoto et al.

(10) Patent No.: US 7,387,951 B2
(45) Date of Patent: Jun. 17, 2008

(54) METHOD OF DICING SEMICONDUCTOR WAFER INTO CHIPS, AND APPARATUS USING THIS METHOD

(75) Inventors: Masayuki Yamamoto, Osaka (JP); Saburo Miyamoto, Mie-ken (JP)

(73) Assignee: Nitto Denko Corporation, Osaka (JP)

( * ) Notice: Subject to any disclaimer, the term of this patent is extended or adjusted under 35 U.S.C. 154(b) by 129 days.

(21) Appl. No.: 11/084,133

(22) Filed: Mar. 21, 2005

(65) Prior Publication Data
US 2005/0215033 A1    Sep. 29, 2005

(30) Foreign Application Priority Data
Mar. 29, 2004    (JP)    ............... 2004-096056

(51) Int. Cl.
*H01L 21/00*    (2006.01)
(52) U.S. Cl. ............... 438/464; 438/33; 438/68; 438/107; 438/113; 257/618; 257/622
(58) Field of Classification Search ............... 438/33, 438/68, 107, 113, 460–465; 257/618, 622
See application file for complete search history.

(56) References Cited

U.S. PATENT DOCUMENTS

| | | | |
|---|---|---|---|
| 6,297,131 B1 * | 10/2001 | Yamada et al. | 438/464 |
| 6,344,402 B1 * | 2/2002 | Sekiya | 438/460 |
| 6,448,151 B2 * | 9/2002 | Tateishi | 438/458 |
| 6,767,426 B1 | 7/2004 | Yamamoto | |
| 6,872,634 B2 * | 3/2005 | Koizumi et al. | 438/460 |
| 6,992,026 B2 * | 1/2006 | Fukuyo et al. | 438/797 |
| 7,005,317 B2 * | 2/2006 | Chin et al. | 438/106 |
| 2002/0055238 A1 * | 5/2002 | Sugino et al. | 438/459 |
| 2004/0002199 A1 * | 1/2004 | Fukuyo et al. | 438/460 |
| 2004/0137699 A1 * | 7/2004 | Kurosawa | 438/460 |
| 2005/0064683 A1 * | 3/2005 | Farnworth et al. | 438/464 |

FOREIGN PATENT DOCUMENTS

| | | |
|---|---|---|
| CN | 1433054 A | 7/2003 |
| JP | 2002-334853 A | 11/2002 |
| JP | 2003-033887 A1 | 2/2003 |

OTHER PUBLICATIONS

Chinese Office Action for Chinese Patent Application No. 2005100562688 dated Feb. 15, 2008.

* cited by examiner

*Primary Examiner*—W. David Coleman
*Assistant Examiner*—Su C Kim
(74) *Attorney, Agent, or Firm*—Cheng Law Group PLLC

(57) ABSTRACT

The invention relates to a semiconductor wafer dicing method of dicing a semiconductor wafer along parting lines into chips. The semiconductor wafer in which parting lines along which the semiconductor wafer is diced into chips are formed is held by an adhesive tape. By radially drawing the adhesive tape in a state where the chips in the semiconductor wafer are not parted from each other, the chips are parted from each other and clearances among the chips are extended.

8 Claims, 5 Drawing Sheets

METHOD OF DICING SEMICONDUCTOR WAFER INTO CHIPS, AND APPARATUS USING THIS METHOD

BACKGROUND OF THE INVENTION

(1) Field of the Invention

The invention relates to a method of dicing a semiconductor wafer into small pieces (chips).

(2) Description of the Related Art

There has been known a method of dicing a semiconductor wafer into chips. According to the method, a back face of the semiconductor wafer a surface of which is protected with a protective tape is ground (back grinding) to a desired thickness, and the resultant semiconductor wafer is mounted on a dicing ring in a state where the back face thereof is adhered to an adhesive tape. Subsequently, the protective tape on the surface of the wafer is separated and, after that, parting lines as narrow trenches in the vertical and horizontal directions are formed with a diamond cutter or the like along scribing lines in the surface of the semiconductor wafer. After that, a pressing member such as a roller is pressed against the back face of the adhesive tape to make a bending stress concentrated on the parting lines, thereby parting the semiconductor wafer into chips. Finally, the adhesive tape is drawn radially to extend the clearances among the chips.

There has been also developed a technique which suppresses generation of dust accompanying formation of parting lines by forming a modified part in a semiconductor wafer with a laser to thereby obtain a parting line as compared with the case of using a diamond cutter (see JP-A 2003-33887).

In the conventional dicing technique, however, at the time of dicing a semiconductor wafer along parting lines formed in any of various modes, an external force is applied to the back side of the adhesive tape adhered to the semiconductor wafer to make the bending stress concentrated on the parting lines. There is consequently a possibility that the pattern on the surface of the wafer is damaged due to occurrence of cracking, adhesion of dust generated by the dicing to the surface of a chip, or the like.

SUMMARY OF THE INVENTION

The invention has been made in view of the aforementioned circumstances, and it is therefore an object of the invention is to provide a semiconductor wafer dicing method capable of performing a dicing process without occurrence of cracking, adhesion of dust to the surface of a chip, or the like.

In order to achieve the object, the invention employs the following configuration.

A method of dicing a semiconductor wafer into chips, which includes the step of: holding a semiconductor wafer in which parting lines along which the semiconductor wafer is parted into chips are formed is held by an adhesive tape and, after that, radially drawing the adhesive tape in a state where the chips of the semiconductor wafer held on the adhesive tape are not separated from each other, thereby separating the chips from each other and extending clearances among the chips.

According to the method of the invention, a tensile stress in the direction along the tape surface is concentrated on the parting lines in the semiconductor wafer firmly adhered to and held by the adhesive tape when the adhesive tape is drawn, breaking along the parting lines progresses, so that the semiconductor wafer is diced into chips. Simultaneously, the chips are separated from each other by radial drawing of the adhesive tape, clearances are formed among the chips, and dust generated by the wafer breaking drop in the clearances. As a result, the dust does not move onto and is not adhered to the surface of a chip.

Preferably, the method of the invention further includes the steps of: forming parting lines in the semiconductor wafer a back face of which is ground in a state where a protective tape is adhered to a surface of the semiconductor wafer; adhering the adhesive tape to the back face of the semiconductor wafer in which the parting lines are formed; separating the protective tape from the semiconductor wafer after the adhesive tape is adhered to the back face of the semiconductor wafer; and radially drawing the adhesive tape after separation of the protective tape.

In the step of forming the parting lines, preferably, the back face of the semiconductor wafer is scanned with a laser beam or is cut with a diamond cutter to form the parting lines.

According to the method of the invention, a very fragile modified layer is formed in the semiconductor wafer. The modified layer serves as parting lines for making chips. Thus, dust is not generated by the process of forming the parting lines.

Preferably, the method of the invention further includes the steps of: adhering an adhesive tape to the back face of the semiconductor wafer the back face of which is ground in a state where a protective tape is adhered to the surface of the semiconductor wafer, and holding the semiconductor wafer by an auxiliary ring; separating the protective tape from the surface of the semiconductor wafer held by the auxiliary ring; forming parting lines in the semiconductor wafer from which the protective tape is separated; radially drawing the adhesive tape in the auxiliary ring after formation of the parting lines; and holding the adhesive tape drawn in the auxiliary ring by using another dicing ring.

According to the method of the invention, a group of chips parted from the semiconductor wafer by drawing the adhesive tape can be held by the dicing ring via the adhesive tape, so that the chips can be easily transported to the subsequent die-bonding process.

In the step of forming the parting lines, preferably, the back face of the semiconductor wafer is scanned with a laser beam or is cut with a diamond cutter to form the parting lines.

According to the method of the invention, a very fragile modified layer is formed in the semiconductor wafer. The modified layer serves as parting lines for making chips. Thus, dust is not generated by the process of forming the parting lines.

In the method of the invention, preferably, the adhesive tape is of an ultraviolet curing type, and the adhesive tape is drawn and, after that, irradiated with ultraviolet rays.

According to the method of the invention, in the step of drawing the adhesive tape, since the semiconductor wafer is firmly held by the adhesive tape, the group of chips diced along the parting lines are parted along the parting lines when the adhesive tape is drawn. By reducing the adhesion of the adhesive tape by irradiation with ultraviolet rays after drawing of the adhesive tape, the parted chips can be easily separated from the adhesive tape.

In the method of the invention, preferably, a drawing amount of the adhesive tape is controlled.

According to the method of the invention, the entire face of the adhesive tape can be uniformly drawn.

Preferably, the drawing amount of the adhesive tape is controlled by making the temperature in a center portion of the adhesive tape and that in a peripheral portion different from each other or, alternatively, the temperature difference in the adhesive tape is determined by a distance of the adhesive tape adhered from the center of the semiconductor wafer to an outer edge and a distance from the outer edge of the semiconductor wafer to a terminating end of the exposed adhesive tape.

According to the method of the invention, when the distance from the outer edge of the semiconductor wafer to the drawing cylinder is long, since the peripheral portion of the adhesive tape to which the semiconductor wafer is not adhered draws more than the center portion in which drawing is suppressed by strong adhesion of the semiconductor wafer, by causing a temperature difference so that the temperature of the center portion of the adhesive tape becomes higher than that of the peripheral portion, drawing of the center portion of the adhesive tape is promoted and the entire face of the adhesive tape can be uniformly drawn.

When the distance from the outer edge of the semiconductor wafer to the drawing cylinder is short, a radial drawing force tends to be concentrated on the center portion of the adhesive tape in the process of drawing the adhesive tape, and the peripheral portion draws less than the center portion. Consequently, under such conditions, by causing a temperature difference so that the temperature of the peripheral portion of the adhesive tape becomes higher than that in the center portion, the entire face of the adhesive tape can be uniformly drawn.

To be concrete, in the step of drawing the adhesive tape, preferably, the temperature in the center portion and that in the peripheral portion in the adhesive tape are made different from each other by blowing hot air.

According to the method of the invention, by making the hot air blown to the center portion (or the peripheral portion) flow also to the peripheral portion (or the center portion), a smooth temperature distribution can be attained while attaining the temperature difference between the peripheral portion and the center portion.

In order to achieve the object, the invention also employs the following configuration.

An apparatus for dicing a semiconductor wafer into chips, which includes: means for forming parting lines for dicing the semiconductor wafer into chips by scanning the semiconductor wafer along a pattern in the surface of the semiconductor wafer in the vertical and horizontal directions; means for sandwiching a portion of an adhesive tape at a distance from the outer edge of the semiconductor wafer so as to surround the semiconductor wafer, the portion being on the outside of the outer edge of the semiconductor wafer, in a state where the adhesive tape wider than the semiconductor wafer is adhered to the back face of the semiconductor wafer; means which comes into contact with a portion in the adhesive tape exposed between the outer edge of the semiconductor wafer and the sandwiching means and pushes up the semiconductor wafer with the adhesive tape from below; means for adhering a dicing ring to the adhesive tape so that the semiconductor wafer is positioned in the center in a state where the semiconductor wafer is pushed up by the push-up means; and means for cutting the adhesive tape adhered to the dicing ring along the shape of the dicing ring.

With this configuration, the method of the invention can be suitably carried out.

In the apparatus of the invention, preferably, the adhesive tape is of an ultraviolet curing type. Preferably, the apparatus further includes means for irradiating the adhesive tape, which is of an ultraviolet curing type, with ultraviolet rays after the semiconductor wafer with the adhesive tape is pushed up by the push-up means, or means for heating the adhesive tape in a state where the semiconductor wafer is pushed up by the push-up means.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Embodiments of the invention will be described below with reference to the drawings.

First Embodiment

FIGS. 1A to 1E and FIGS. 2F to 2I show processes of a first embodiment of a method of dicing a semiconductor wafer into chips.

Figure 1A:
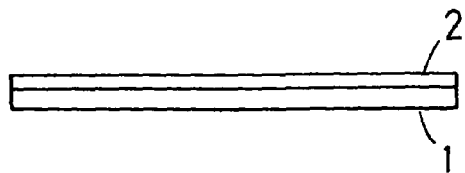
FIGS. 1A to 1E are process diagrams of a first embodiment of a method of the invention.

As shown in FIG. 1A, a semiconductor wafer 1 (hereinafter, appropriately referred to as "wafer") to be subjected to a dicing process is in a state where the surface on which a pattern is formed is protected with a protective tape 2 and the back face is ground to a predetermined thickness. Herein, an ultraviolet curing tape is used as the protective tape 2.

Figure 1B:
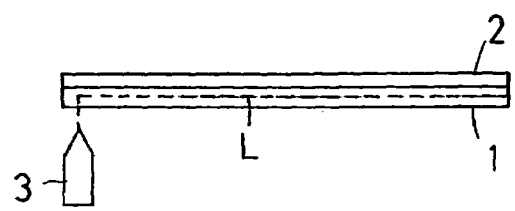

As shown in FIG. 1B, the back face of the transported semiconductor wafer 1 is scanned with a laser 3 in the vertical and horizontal directions along the pattern on the surface of the wafer, thereby forming a fragile modified layer in the semiconductor wafer 1 in the vertical and horizontal directions. The modified layer becomes a parting line L for making chips. The laser 3 corresponds to parting line formation means of the invention.

Figure 1C:
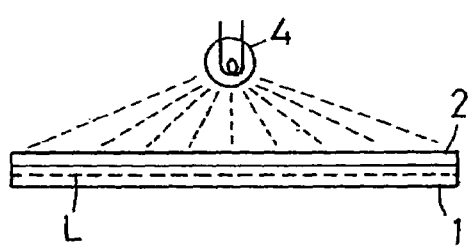

As shown in FIG. 1C, the surface of the protective tape 2 is irradiated with ultraviolet rays from an ultraviolet lamp 4 to decrease the adhesion of the protective tape 2.

Figure 1D:
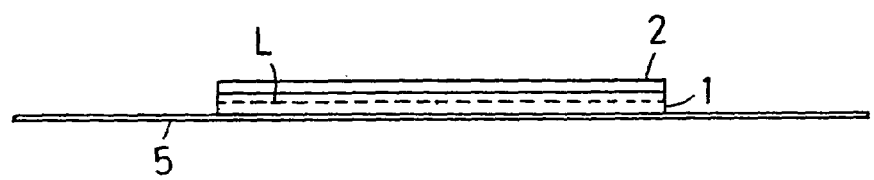
Figure 1E:
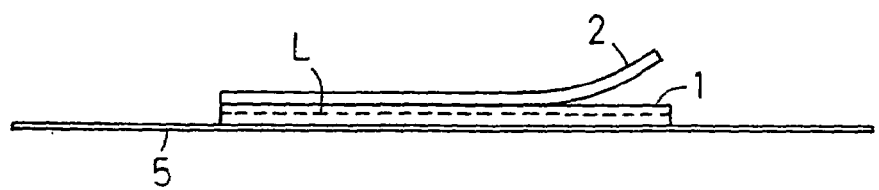

As shown in FIG. 1D, the semiconductor wafer 1 irradiated with the ultraviolet rays is adhered to and held by an adhesive tape 5 of an ultraviolet curing type. After that, as shown in FIG. 1E, the protective tape 2 whose adhesion has decreased is separated and removed from the surface of the semiconductor wafer 1.

Figure 2F:
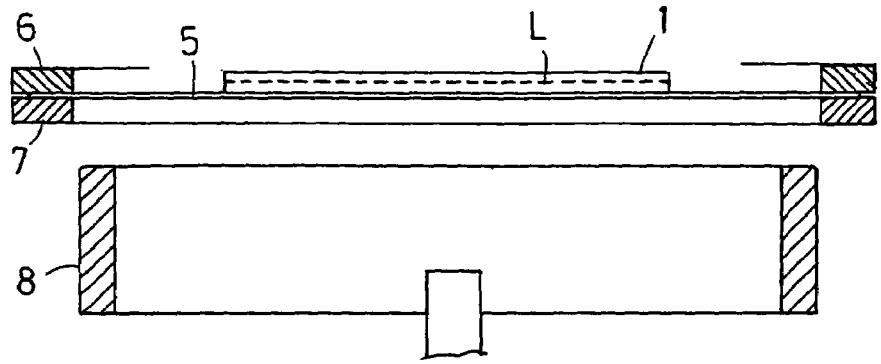
FIGS. 2F to 2I are process diagrams of the first embodiment of the method of the invention.

As shown in FIG. 2F, the adhesive tape 5 is adhered to and held by an auxiliary ring 6, and the semiconductor wafer 1 is transported to a position above a drawing cylinder 8 in a state where the peripheral portion of the adhesive tape 5 is sandwiched by the auxiliary ring 6 and a sandwiching ring 7 from above and below. The auxiliary ring 6 and the sandwiching ring 7 correspond to sandwiching means of the invention.

Figure 2G:
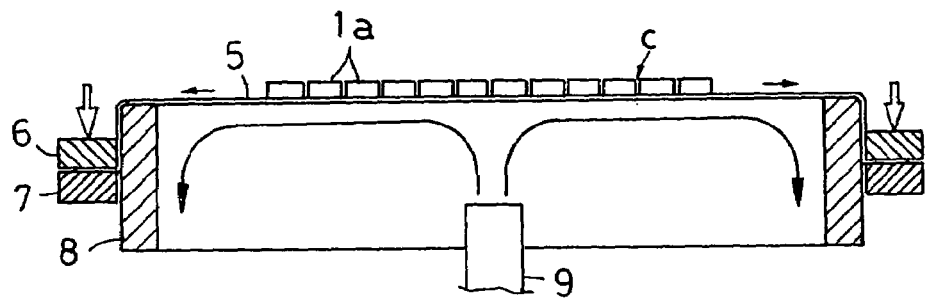
Figure 3:
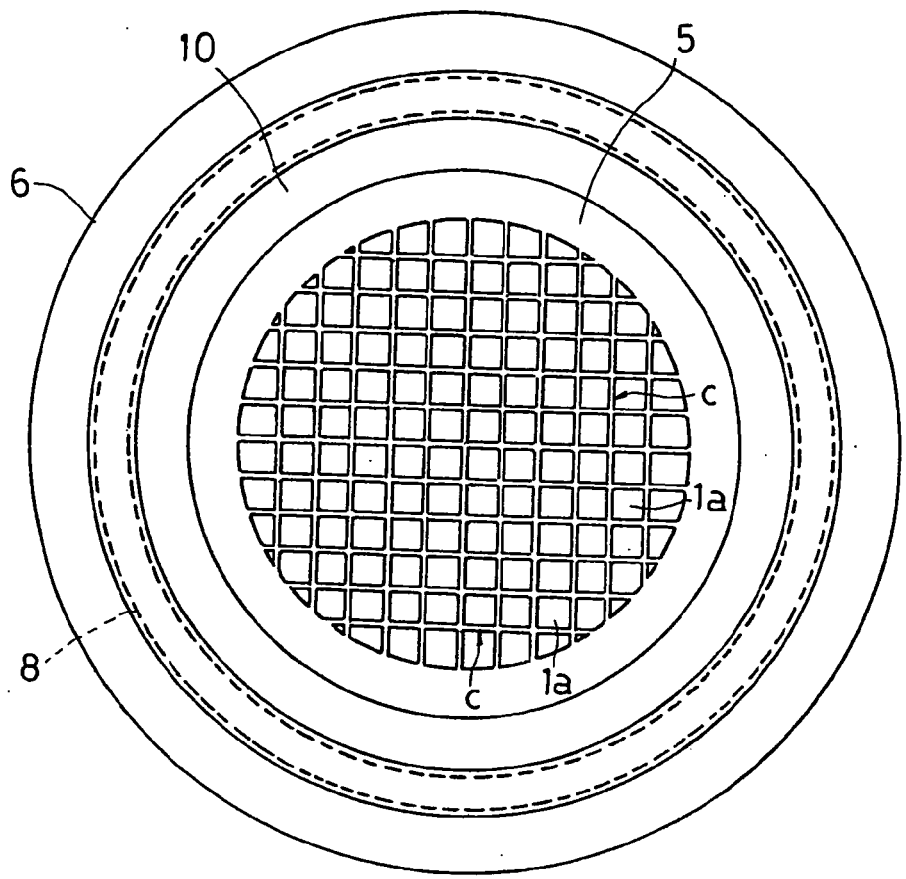
FIG. 3 is a plan view showing a semiconductor wafer in a dicing process.

As shown in FIG. 2G, the auxiliary ring 6 and the sandwiching ring 7 are fit around the drawing cylinder 8 and pushed down (or the drawing cylinder 8 is pushed up), thereby making the adhesive tape 5 drawn radially in a state where it covers the upper end of the drawing cylinder 8. When the adhesive tape 5 is drawn, a tensile stress is concentrated on the parting line L in the semiconductor wafer 1 firmly adhered to and held by the adhesive tape 5, so that breaking along the parting lines L in the vertical and horizontal directions progresses as shown in FIG. 3 and the semiconductor wafer 1 is diced into chips. The chips 1a are separated from each other by the radial drawing of the adhesive tape 5 and clearances "c" are formed among the chips. The drawing cylinder 8 corresponds to push-up means of the invention.

In this case, when the distance from the periphery of the semiconductor wafer 1 to the draw cylinder 8 is long, the peripheral portion of the tape to which the semiconductor wafer 1 is not adhered tends to draw more than the tape center portion in which drawing is suppressed by adhesion of the semiconductor wafer 1. Consequently, hot air is blown from a nozzle 9 disposed at the center of the drawing cylinder 8 from the center portion of the adhesive tape 5 toward the peripheral portion to cause a temperature difference so that the temperature in the center portion of the adhesive tape 5 becomes higher than that of the peripheral portion. As a result, the whole adhesive tape 5 is uniformly drawn. The nozzle 9 corresponds to heating means of the invention.

Figure 2H:
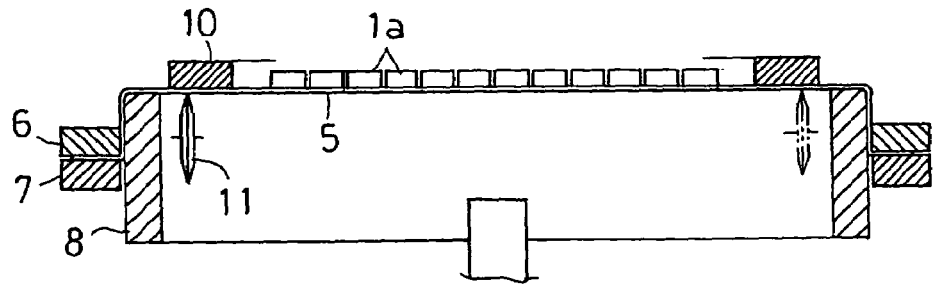

After completion of the dicing process, as shown in FIG. 2H, a dicing ring 10 is adhered onto the adhesive tape 5 by adhering means (not shown) and the adhesive tape 5 is cut along the dicing ring 10 by a cutter 11 which rotates and moves concentrically with the dicing ring 10. The cutter 11 corresponds to cutting means of the invention.

Figure 2I:
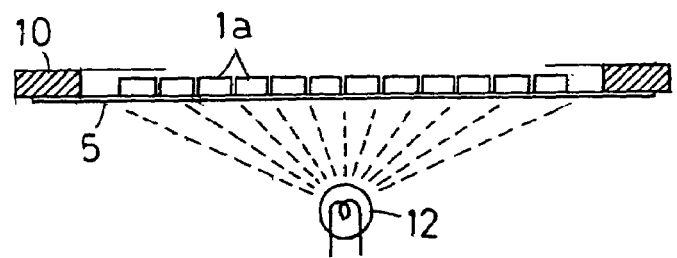

After that, as shown in FIG. 2I, the portion of the adhesive tape 5 which holds the chips is irradiated with ultraviolet rays from an ultraviolet lamp 12. The adhesion of the adhesive tape 5 irradiated with ultraviolet rays decreases, so that it becomes easy to separate the adhesive tape 5 from the chips 1a by a vacuum pickup nozzle or the like in the subsequent die-bonding process. The ultraviolet lamp 12 corresponds to ultraviolet ray irradiation means of the invention.

Figure 4:
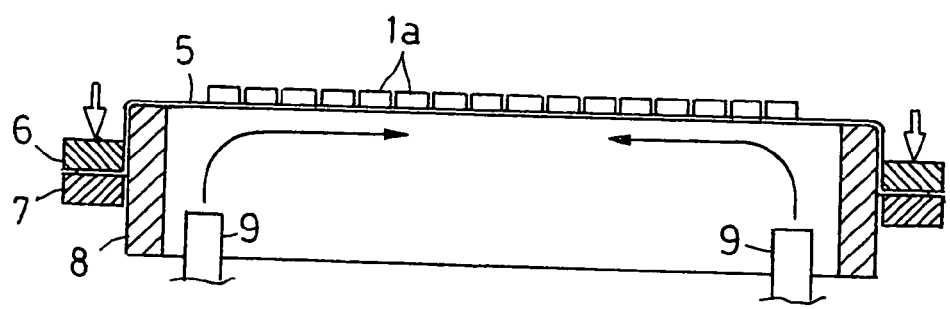
FIG. 4 is a vertical sectional view showing the dicing process in a modification of the first embodiment.

When the distance from the peripheral portion of the semiconductor wafer 1 to the drawing cylinder 8 is short, the radial drawing force tends to be concentrated in the center portion of the adhesive tape 5 in the process of drawing the adhesive tape 5, so that the peripheral portion draws less than the center portion. Consequently, under such conditions, as shown in FIG. 4, hot air is blown from the peripheral portion of the adhesive tape to the center portion from the group of nozzles 9 disposed in the periphery of the drawing cylinder 8 to cause a temperature difference so that the temperature in the peripheral portion of the adhesive tape 5 becomes higher than that in the center portion. As a result, the whole adhesive tape 5 can be uniformly drawn.

Second Embodiment

FIGS. 5 and 6 show processes of a second embodiment of the method of dicing a semiconductor wafer into chips.

Figure 5A:
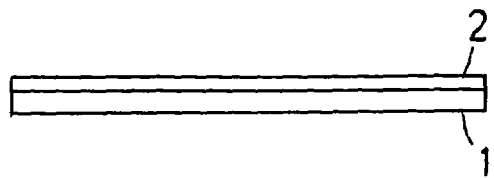
FIGS. 5A to 5E are process diagrams of a second embodiment of the method of the invention.

As shown in FIG. 5A, the semiconductor wafer 1 to be subjected to a dicing process is in a state where the surface on which a pattern is formed is protected with the protective tape 2 and the back face is ground to a predetermined thickness. Also herein, an adhesive tape of an ultraviolet ray curing type is used as the protective tape 2.

Figure 5B:
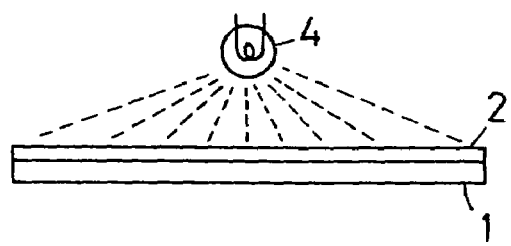

As shown in FIG. 5B, the protective tape 2 is irradiated with ultraviolet rays from the ultraviolet lamp 4 to decrease the adhesion of the protective tape 2.

Figure 5C:
Figure 5D:
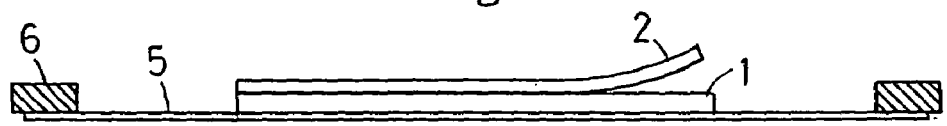

As shown in FIG. 5C, the semiconductor wafer 1 irradiated with the ultraviolet rays is adhered to and held by the adhesive tape 5 of an ultraviolet curing type which is adhered to and held by the auxiliary ring 6 and, as shown in FIG. 5D, the protective tape 2 whose adhesion has decreased is separated and removed from the surface of the semiconductor wafer 1.

Figure 5E:
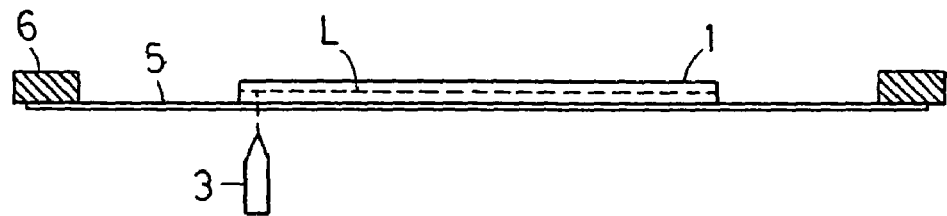

As shown in FIG. 5E, the back face of the adhesive tape 5 is scanned with the laser 3 in the vertical and horizontal directions along the pattern in the surface of the wafer, thereby forming a fragile modified layer in the semiconductor wafer 1 in the vertical and horizontal directions. The modified layer becomes a parting line L for making chips.

Figure 6F:
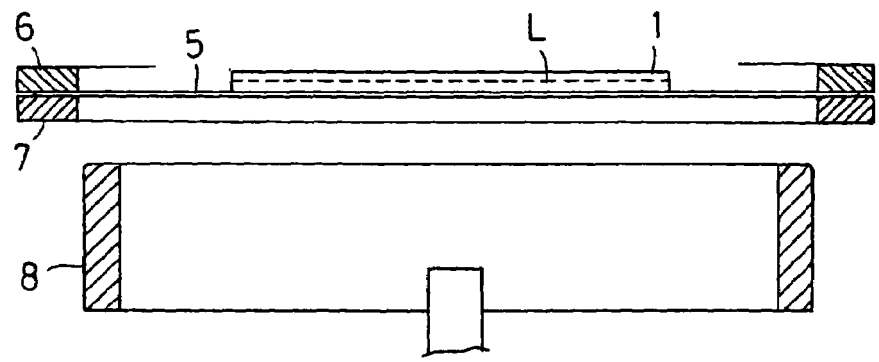
FIGS. 6F to 6I are process diagrams of the second embodiment of the method of the invention.

As shown in FIG. 6F, the semiconductor wafer 1 is transported to a position above the drawing cylinder 8 in a state where the peripheral portion of the adhesive tape 5 is sandwiched by the auxiliary ring 6 and the sandwiching ring 7 from above and below.

Figure 6G:
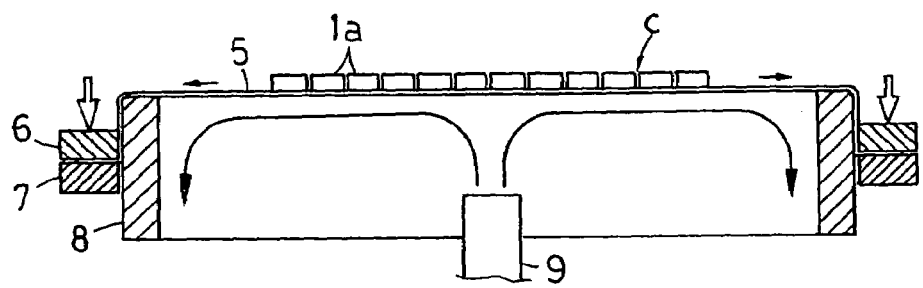

As shown in FIG. 6G, the auxiliary ring 6 and the sandwiching ring 7 are fit around the drawing cylinder 8 and pushed down, thereby making the adhesive tape 5 drawn radially in a state where it covers the upper end of the drawing cylinder 8. When the adhesive tape 5 is drawn, a tensile stress is concentrated on the parting lines L in the semiconductor wafer 1 firmly adhered to and held by the adhesive tape 5, so that breaking along the parting lines L in the vertical and horizontal directions progresses and the semiconductor wafer 1 is diced into chips. The chips 1a are separated from each other by the radial drawing of the adhesive tape 5 and clearances "c" are formed among the chips 1a.

In this case as well, when the distance from the peripheral portion of the semiconductor wafer 1 to the drawing cylinder 8 is long, the peripheral portion of the tape to which the semiconductor wafer 1 is not adhered tends to draw more than the tape center portion in which drawing is suppressed by adhesion of the semiconductor wafer 1. Consequently, hot air is blown from the nozzle 9 disposed at the center of the drawing cylinder 8 from the center portion of the adhesive tape 5 toward the peripheral portion to cause a temperature difference so that the temperature in the center portion of the adhesive tape 5 becomes higher than that of the peripheral portion. As a result, the whole adhesive tape 5 is uniformly drawn.

Figure 6H:
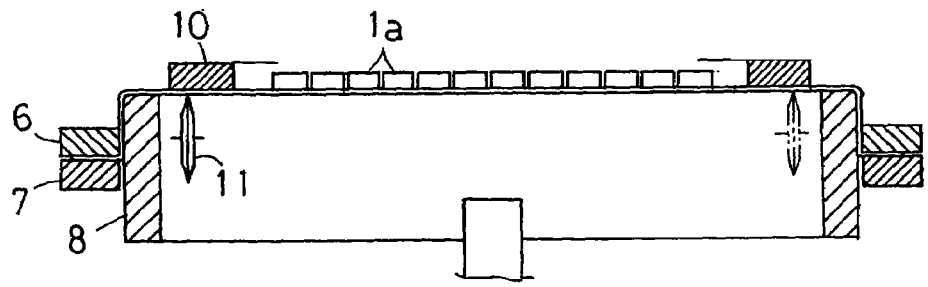

After completion the dicing process, as shown in FIG. 6H, the dicing ring 10 is adhered onto the adhesive tape 5 and the adhesive tape 5 is cut along the dicing ring 10 by the cutter 11 which rotates and moves concentrically with the dicing ring 10.

Figure 6I:
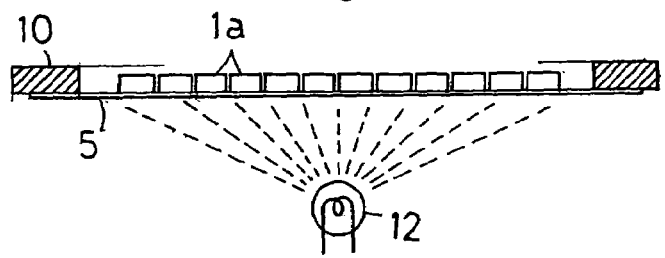

After that, as shown in FIG. 6I, the adhesive tape 5 is irradiated with ultraviolet rays from the ultraviolet lamp 12. The adhesion of the adhesive tape 5 irradiated with ultraviolet rays decreases, so that it becomes easy to separate the adhesive tape 5 from the chips 1a by a vacuum pickup nozzle or the like in the subsequent die-bonding process.

Others (1) As a technique for forming the parting line L, it is preferable to use the laser as described above from the viewpoint of suppression of generation of dust. Alternatively, the parting line L can be also formed by using a mechanical cutting unit such as a diamond cutter.

(2) The adhesive tape is not limited to the ultraviolet curing adhesive tape but a pressure sensitive adhesive tape can be also used.

(3) As a technique which causes the temperature difference in the adhesive tape, in addition to the supply of hot air, arbitrary heating techniques such as irradiation of infrared rays by an infrared ray lamp can be also used.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method of dicing a semiconductor wafer into chips, comprising the steps of:
   forming parting lines on a semiconductor wafer in order to divide the semiconductor wafer into chips, and holding the semiconductor wafer by an adhesive tape;
   placing the chips of the semiconductor wafer held by the adhesive tape on a single plane without separating the chips from each other, and
   radially drawing the adhesive tape such that the chips are separated from each other and a clearance is formed between the adjoining chips while the chips are on the single plane;
   wherein the temperature difference in the adhesive tape is determined by a distance of the adhesive tape adhered from the center of the semiconductor wafer to an outer edge and a distance from the outer edge of the semiconductor wafer to a terminating end of the exposed adhesive tape,
   wherein a drawing amount of the adhesive tape is controlled by making a center portion temperature in a center portion of the adhesive tape and a peripheral portion temperature in a peripheral portion of the adhesive tape different from one another, and
   wherein in the step of drawing the adhesive tape, the center portion temperature in the center portion and the peripheral portion temperature in the peripheral portion in the adhesive tape are made different from one another by blowing air having a temperature higher than ambient air.

2. The method of claim 1, farther comprising the steps of:
   forming parting lines in a grounded back face of the semiconductor wafer where a protective tape is adhered to a surface of the semiconductor wafer;
   adhering the adhesive tape to the back face of the semiconductor wafer in which the parting lines are formed;
   separating the protective tape from the semiconductor wafer after the adhesive tape is adhered to the back face of the semiconductor wafer; and
   radially drawing the adhesive tape after separation of the protective tape.

3. The method of claim 2, wherein
   in the step of forming the parting lines, the back face of the semiconductor wafer is scanned with a laser beam to form the parting lines.

4. The method of claim 2, wherein
   in step of forming the parting lines, the back face of the semiconductor wafer is cut with a diamond cutter to form the parting lines.

5. The method of claim 1, further comprising the steps of:
   adhering an adhesive tape to a grounded back face of the semiconductor wafer where a protective tape is adhered to the surface of the semiconductor wafer, and holding the semiconductor wafer by an auxiliary ring;
   separating the protective tape from the surface of the semiconductor wafer held by the auxiliary ring;
   forming parting lines in the semiconductor wafer from which the protective tape is separated;
   radially drawing the adhesive tape in the auxiliary ring after formation of the parting lines; and
   holding the adhesive tape drawn in the auxiliary ring by using another dicing ring.

6. The method of claim 5, wherein
   in the step of forming the parting lines, the back face of the semiconductor wafer is scanned with a laser beam to form the parting lines.

7. The method of claim 5, wherein
   in step of forming the parting lines, the back face of the semiconductor wafer is cut with a diamond cutter to form the parting lines.

8. The method of claim 1, wherein
   the adhesive tape is of an ultraviolet curing type, and the adhesive tape is drawn and, after that, irradiated with ultraviolet rays.

* * * * *